United States Patent
Wang et al.

(10) Patent No.: US 9,793,300 B2
(45) Date of Patent: Oct. 17, 2017

(54) THIN FILM TRANSISTOR AND CIRCUIT STRUCTURE

(71) Applicant: BOE TECHNOLOGY GROUP CO., LTD., Beijing (CN)

(72) Inventors: Xiaolin Wang, Beijing (CN); Xing Yao, Beijing (CN); Yoonsung Um, Beijing (CN); Seungwoo Han, Beijing (CN); Yunsik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/900,960

(22) PCT Filed: Jun. 19, 2015

(86) PCT No.: PCT/CN2015/081891
§ 371 (c)(1),
(2) Date: Dec. 22, 2015

(87) PCT Pub. No.: WO2016/107099
PCT Pub. Date: Jul. 7, 2016

(65) Prior Publication Data
US 2016/0372487 A1 Dec. 22, 2016

(30) Foreign Application Priority Data
Dec. 31, 2014 (CN) .......................... 2014 1 0855068

(51) Int. Cl.
*H01L 27/14* (2006.01)
*H01L 27/12* (2006.01)
(Continued)

(52) U.S. Cl.
CPC ........ *H01L 27/124* (2013.01); *H01L 27/0207* (2013.01); *H01L 27/1255* (2013.01);
(Continued)

(58) Field of Classification Search
CPC ...................... H01L 27/1214; H01L 29/66757
(Continued)

(56) References Cited

U.S. PATENT DOCUMENTS

| | | |
|---|---|---|
| 2005/0275038 A1 | 12/2005 | Shih et al. |
| 2005/0275238 A1 | 12/2005 | Yang |

(Continued)

FOREIGN PATENT DOCUMENTS

| | | |
|---|---|---|
| CN | 1815536 A | 8/2006 |
| CN | 101946327 A | 1/2011 |

(Continued)

OTHER PUBLICATIONS

First Office Action regarding Chinese application No. 201410855068.8, dated Nov. 28, 2016. Translation provided by Dragon Intellectual Property Law Firm.

(Continued)

*Primary Examiner* — Tan N Tran
(74) *Attorney, Agent, or Firm* — Harness, Dickey & Pierce, P.L.C.

(57) ABSTRACT

The present disclosure provides a TFT and a circuit structure to improve the characteristics of the threshold voltage drift of the TFT. The TFT includes a gate electrode, a semiconductor layer, an etch stop layer, and a source electrode and a drain electrode connected to the semiconductor layer. The TFT further includes a stopping structure arranged over the etch stop layer. The stopping structure is electrically isolated from the source electrode and the drain electrode, and an orthogonal projection of the stopping structure onto the etch stop layer at least partially overlaps an orthogonal projection of the semiconductor layer onto the etch stop layer. The present disclosure improves the characteristics of the threshold voltage drift of the TFT.

10 Claims, 6 Drawing Sheets

(51) Int. Cl.
*H01L 29/786* (2006.01)
*H01L 27/02* (2006.01)
*H01L 29/417* (2006.01)
*H01L 29/423* (2006.01)

(52) U.S. Cl.
CPC .. *H01L 29/41733* (2013.01); *H01L 29/42384* (2013.01); *H01L 29/786* (2013.01); *H01L 29/78606* (2013.01)

(58) Field of Classification Search
USPC ................................. 257/59, 72, 258, 432
See application file for complete search history.

(56) References Cited

U.S. PATENT DOCUMENTS

| | | |
|---|---|---|
| 2006/0081985 A1 | 4/2006 | Beach et al. |
| 2011/0079784 A1* | 4/2011 | Im .................. H01L 27/3262 257/59 |
| 2013/0092941 A1* | 4/2013 | Den Boer ......... H01L 27/14609 257/53 |
| 2013/0256666 A1* | 10/2013 | Chang ............... H01L 29/78693 257/57 |
| 2015/0144952 A1* | 5/2015 | Kim ................... H01L 27/3262 257/72 |

FOREIGN PATENT DOCUMENTS

| | | |
|---|---|---|
| CN | 102244005 A | 11/2011 |
| CN | 202601619 U | 12/2012 |
| CN | 104091830 A | 10/2014 |
| CN | 104465787 A | 3/2015 |

OTHER PUBLICATIONS

International Search Report and Written Opinion of the International Searching Authority for international application No. PCT/CN2015/081891, dated Jun. 19, 2015.
Second Office Action regarding Chinese Application No. 201410855068.8, dated Jun. 2, 2017. Translation provided by Dragon Intellectual Property Law Firm.

* cited by examiner

THIN FILM TRANSISTOR AND CIRCUIT STRUCTURE

CROSS-REFERENCE TO RELATED APPLICATIONS

The present application is the U.S. national phase of PCT Application No. PCT/CN2015/081891 filed on Jun. 19, 2015, which claims a priority of the Chinese patent application No. 201410855068.8 filed on Dec. 31, 2014, the entire contents of both of which are incorporated herein by reference in their entirety.

TECHNICAL FIELD

The present disclosure relates to semiconductor elements, in particular to a thin film transistor (TFT) and a circuit structure.

BACKGROUND

As one kind of field effect transistors (FETs), an existing TFT has a wide range of application.

Generally speaking, the TFT includes a gate electrode, a gate insulating layer, a semiconductor layer, a source electrode and a drain electrode. Conductivity of a channel layer may be adjusted by changing a voltage applied to the gate electrode, so as to control on and off states between the source electrode and the drain electrode.

For an N-type TFT, when a voltage applied to its gate electrode is greater than a threshold voltage, an on state is formed between its source electrode and its drain electrode; otherwise, an off state is formed between its source electrode and its drain electrode. For a P-type TFT, the contrary is the case, i.e., when a voltage applied to its gate electrode is less than a threshold voltage, an on state is formed between its source electrode and its drain electrode; otherwise, an off state is formed between its source electrode and its drain electrode. Hence, a size of the voltage applied to the gate electrode depends on the threshold voltage.

Therefore, when the TFT serves as a switching transistor, it is impossible to switch between on and off states for the source electrode and the drain electrode accurately due to the threshold voltage drift.

For an active matrix organic light-emitting diode (AMOLED) pixel circuit, brightness evenness of OLED may be adversely affected by a change in the threshold voltage of the TFT which serves as a driving transistor, thereby adversely affecting display effect of an AMOLED panel.

Hence, no matter in which kind of circuit structures the TFT is used, normal operations of the circuit structure may be adversely affected by the threshold voltage drift of the TFT.

SUMMARY

An object of the present disclosure is to provide a TFT and a circuit structure, so as to improve the characteristics of the threshold voltage drift of the TFT.

In order to achieve the above object, the present disclosure provides in some embodiments a TFT, including a gate electrode, a semiconductor layer, an etch stop layer, and a source electrode and a drain electrode connected to the semiconductor layer. The TFT further includes a stopping structure arranged over the etch stop layer. The stopping structure is electrically isolated from the source electrode and the drain electrode, and an orthogonal projection of the stopping structure onto the etch stop layer at least partially overlaps an orthogonal projection of the semiconductor layer onto the etch stop layer.

Alternatively, the orthogonal projection of the stopping structure onto the etch stop layer is located within a region where the orthogonal projection of the semiconductor layer onto the etch stop layer is located.

Alternatively, the stopping structure, the source electrode and the drain electrode are formed by a single etching process.

Alternatively, a length of a perpendicular line between parallel facing sides of the source electrode and the drain electrode is D; a width of the stopping structure in a direction parallel to the perpendicular line is W, and W/D is in a range of from 1/20 to 18/20.

Alternatively, the source electrode and the drain electrode are of comb-like structures arranged opposite to each other in an interdigitated manner; teeth of the comb-like structures arranged opposite to each other in an interdigitated manner are divided into a plurality of tooth groups; and a spacing distance between the adjacent tooth groups is greater than a distance between the adjacent teeth in the tooth group. The stopping structure is arranged between two adjacent teeth, one of which serves as the source electrode and the other one of which serves as the drain electrode. The teeth adjacent to each other but belonging to different tooth groups serve as the drain electrode simultaneously or the source electrode simultaneously.

Alternatively, the source electrode and the drain electrode are of comb-like structures arranged opposite to each other in an interdigitated manner; two teeth serving as the drain electrode are arranged between at least one pair of adjacent teeth serving as the source electrode; and the stopping structure is arranged between the adjacent teeth, one of which serves as the source electrode and the other one of which serves as the drain electrode.

Alternatively, the drain electrode includes: a first comb handle; and a first teeth row and a second teeth row arranged at two sides of the first comb handle, respectively, and electrically connected to the first comb handle. The source electrode includes: a second comb handle; a third teeth row arranged at a side of the second comb handle, electrically connected to the second comb handle and arranged opposite to the first teeth row in an interdigitated manner; a third comb handle electrically connected to the second comb handle; and a fourth teeth row arranged at a side of the third comb handle, electrically connected to the third comb handle and arranged opposite to the second teeth row in an interdigitated manner. The stopping structure is arranged between the two adjacent teeth, one of which serves as the source electrode, and the other one of which serves as the drain electrode.

Alternatively, the second comb handle and the third comb handle define a U shape; the first comb handle, the third teeth row and the fourth teeth row are arranged inside the U shape; and the third teeth row and the fourth teeth row are arranged at two sides of the first comb handle, respectively.

Alternatively, the first teeth row and the third teeth row are arranged between the first comb handle and the second comb handle, and the second teeth row and the fourth teeth row are arranged between the first comb handle and the third comb handle.

In order to achieve the above object, the present disclosure provides in some embodiments a circuit structure including a TFT. The TFT includes a gate electrode, a semiconductor layer, an etch stop layer, and a source electrode and a drain electrode connected to the semiconductor layer. The TFT further includes a stopping structure arranged over the etch stop layer. The stopping structure is electrically isolated from the source electrode and the drain electrode, and an orthogonal projection of the stopping structure onto the etch stop layer at least partially overlaps an orthogonal projection of the semiconductor layer onto the etch stop layer.

Alternatively, the orthogonal projection of the stopping structure onto the etch stop layer is located within a region where the orthogonal projection of the semiconductor layer onto the etch stop layer is located.

Alternatively, the stopping structure, the source electrode and the drain electrode are formed by a single etching process.

Alternatively, a length of a perpendicular line between parallel facing sides of the source electrode and the drain electrode is D; a width of the stopping structure in a direction parallel to the perpendicular line is W, and W/D is in a range of from 1/20 to 18/20.

Alternatively, the source electrode and the drain electrode are of comb-like structures arranged opposite to each other in an interdigitated manner; teeth of the comb-like structures arranged opposite to each other in an interdigitated manner are divided into a plurality of tooth groups; and a spacing distance between the adjacent tooth groups is greater than a distance between the adjacent teeth in the tooth group. The stopping structure is arranged between two adjacent teeth, one of which serves as the source electrode and the other one of which serves as the drain electrode. The teeth adjacent to each other but belonging to different tooth groups serve as the drain electrode simultaneously or the source electrode simultaneously.

Alternatively, the source electrode and the drain electrode are of comb-like structures arranged opposite to each other in an interdigitated manner; two teeth serving as the drain electrode are arranged between at least one pair of adjacent teeth serving as the source electrode; and the stopping structure is arranged between the adjacent teeth, one of which serves as the source electrode and the other one of which serves as the drain electrode.

Alternatively, the circuit structure further includes a capacitor structure, the capacitor structure includes a first polar plate and a second polar plate which is formed by the gate electrode of the TFT, and the first polar plate is arranged at a layer identical to the source electrode and the drain electrode of the TFT and connected to the drain electrode of the TFT.

Alternatively, the circuit structure is a shift register unit, the source electrode and the drain electrode of the TFT are connected to a signal input node and a signal output node, respectively, the gate electrode of the TFT is connected to a pull-up node, one end of the capacitor structure is connected to the pull-up node, and the other end of the capacitor structure is connected to the signal output node.

Alternatively, the drain electrode includes: a first comb handle electrically connected to the first polar plate; and a first teeth row and a second teeth row arranged at two sides of the first comb handle, respectively, and electrically connected to the first comb handle. The source electrode includes: a second comb handle; a third teeth row arranged at a side of the second comb handle, electrically connected to the second comb handle and arranged opposite to the first teeth row in an interdigitated manner; a third comb handle electrically connected to the second comb handle; and a fourth teeth row arranged at a side of the third comb handle, electrically connected to the third comb handle and arranged opposite to the second teeth row in an interdigitated manner. The stopping structure is arranged between the adjacent teeth, one of which serves as the source electrode and the other one of which serves as the drain electrode.

Alternatively, the teeth arranged at at least one side of the first comb handle and arranged opposite to each other in an interdigitated manner are divided into a plurality of tooth groups; and a spacing distance between the adjacent tooth groups is greater than a distance between the adjacent teeth in the tooth group. The teeth adjacent to each other but belonging to different tooth groups serve as the drain electrode simultaneously or the source electrode simultaneously.

Alternatively, an active layer under the first comb handle is removed.

Alternatively, an extension part is further arranged on the first comb handle and extends into a gap between the adjacent tooth groups, and the active layer under the extension part is removed.

In order to achieve the above object, the present disclosure provides in some embodiments a TFT including a source electrode and a drain electrode. The drain electrode includes: a first comb handle; and a first teeth row and a second teeth row arranged at two sides of the first comb handle, respectively, and electrically connected to the first comb handle. The source electrode includes: a second comb handle; a third teeth row arranged at a side of the second comb handle, electrically connected to the second comb handle and arranged opposite to the first teeth row in an interdigitated manner; a third comb handle electrically connected to the second comb handle; and a fourth teeth row arranged at a side of the third comb handle, electrically connected to the third comb handle and arranged opposite to the second teeth row in an interdigitated manner.

Alternatively, teeth arranged at at least one side of the first comb handle and arranged opposite to each other in an interdigitated manner are divided into a plurality of tooth groups; a spacing distance between the adjacent tooth groups is greater than a distance between the adjacent teeth in the tooth group; and the teeth adjacent to each other but belonging to different tooth groups serve as the drain electrode or the source electrode.

According to the TFT and the circuit structure in the embodiments of the present disclosure, a portion of a film in a source-drain metal layer that should have been removed originally is reserved so as to form the stopping structure over the etch stop layer, thereby improving the characteristics of the threshold voltage drift of the TFT and improving the performance thereof.

DETAILED DESCRIPTION

According to a TFT and a circuit structure in one embodiment of the present disclosure, a portion of a film in a source-drain metal layer that should have been removed originally is reserved to form a stopping structure over an etch stop layer. As a result, characteristics of the threshold voltage drift of the TFT are improved, thereby improving the performance thereof.

Figure 1:
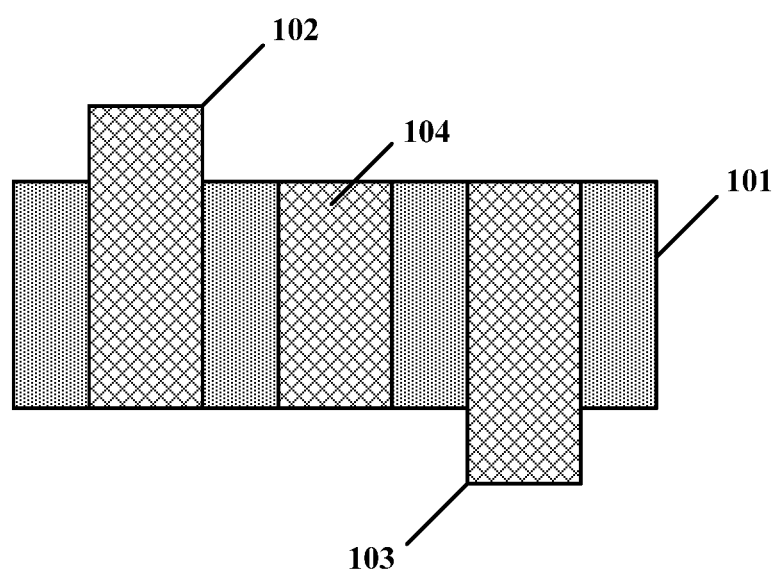
FIG. 1 is a schematic view showing a TFT according to one embodiment of the present disclosure.

As shown in FIG. 1, a TFT in one embodiment of the present disclosure includes a gate electrode, a semiconductor layer 101, an etch stop layer 106, and a source electrode 102 and a drain electrode 103 connected to the semiconductor layer 101. The TFT further includes a stopping structure 104 arranged over the etch stop layer 106.

The stopping structure 104 is electrically isolated from the source electrode 102 and the drain electrode 103. An orthogonal projection of the stopping structure 104 onto the etch stop layer at least partially overlaps an orthogonal projection of the semiconductor layer 101 onto the etch stop layer.

For one skilled in the art of manufacturing TFTs, a source-drain metal layer between the source electrode and the drain electrode of the TFT shall be removed, which is a long-term technology prejudice in the art of manufacturing TFTs. However, the above technology prejudice is overcome in embodiments of the present disclosure, and a portion of a film in the source-drain metal layer, which should have been removed originally, is reserved to form the stopping structure over the etch stop layer. As a result, the characteristics of the threshold voltage drift of the TFT are improved, thereby improving the performance thereof. Beneficial effects of embodiments of the present disclosure will be described hereinafter with a simulation test.

In one embodiment of the present disclosure, the orthogonal projection of the stopping structure onto the etch stop layer at least partially overlapping the orthogonal projection of the semiconductor layer 101 onto the etch stop layer includes:

1. the orthogonal projection of the stopping structure 104 onto the etch stop layer merely partially overlaps the orthogonal projection of the semiconductor layer 101 onto the etch stop layer; or, 2. the orthogonal projection of the stopping structure 104 onto the etch stop layer completely overlaps the orthogonal projection of the semiconductor layer 101 onto the etch stop layer, i.e., the orthogonal projection of the stopping structure 104 onto the etch stop layer is located within a region where the orthogonal projection of the semiconductor layer 101 onto the etch stop layer is located.

In one embodiment of the present disclosure, the stopping structure 104 may be formed by a separate etching process. However, in order to simplify the procedure and reduce the production cost, in one embodiment of the present disclosure, the stopping structure 104, the source electrode 102 and the drain electrode 103 may be formed by a single etching process.

The improvement on the threshold voltage drift of the TFT will be described hereinafter.

Figure 2:
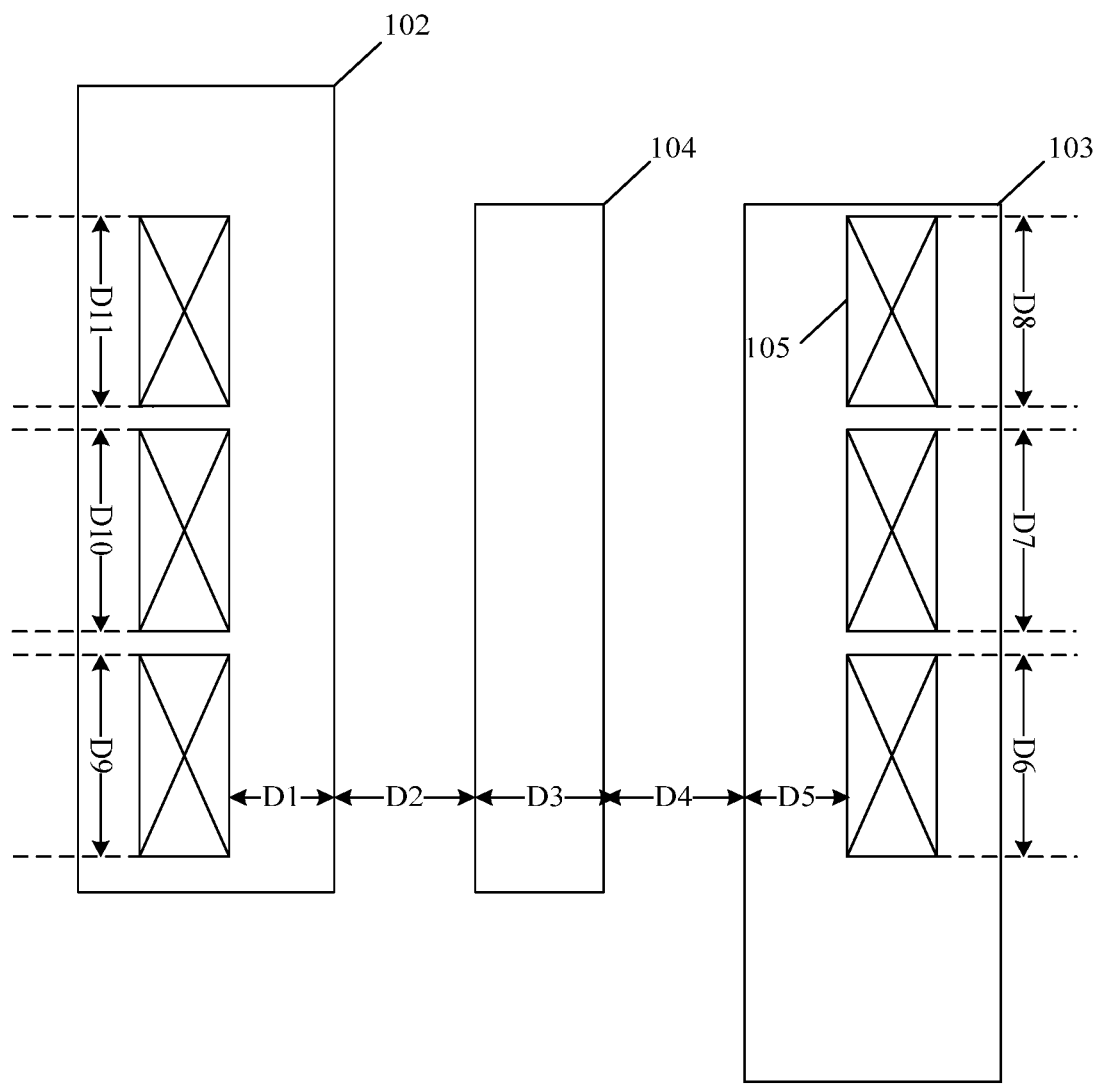
FIG. 2 is a schematic view showing a TFT provided with via-holes according to one embodiment of the present disclosure.

As shown in FIG. 2, for the TFT, its electrical property is closely related to a width-to-length ratio W/L of the TFT.

Figure 8:
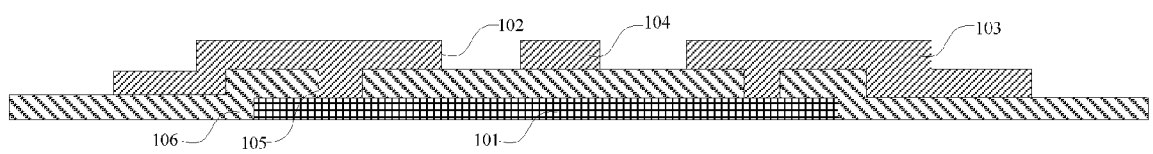
FIG. 8 is a schematic view showing a TFT according to one embodiment of the present disclosure.

As shown in FIG. 2 and FIG. 8, when the source electrode 102 and the drain electrode 103 both are connected to an active layer 101 through via-holes 105 (it should be appreciated that, a connection mode between the source electrode 102/drain electrode 103 and the active layer is not particularly limited herein, i.e., the above connection mode in which the source electrode 102/drain electrode 103 is connected to the active layer through via-holes is not intended to limit the scope of the present disclosure), W is a sum of widths of the via-holes, i.e., W=D6+D7+D8.

Generally, D6=D9, D7=D10 and D8=D11. In other words, the number and the shapes of the via-holes 105 in the source electrode 102 are identical to those of the via-holes 105 in the drain electrode 103. The subsequent test is made by taking the structure shown in FIG. 2 as an example.

L represents a distance between a side of the via-holes 105 in the source electrode 102 and an adjacent side of the via-holes 105 in the drain electrode 103, i.e., L=D1+D2+D3+D4+D5.

One testing experiment of one embodiment of the present disclosure is described in details with an example in which D1=D5 and D2=D4.

Testing conditions include: a voltage difference between the source electrode and the drain electrode is 9.1V; a testing temperature is 50° C.; a light source has a brightness value of 10000 nt; the width-to-length ratio is 25:24; D1=D5=4 μm, D2=D4=5.5 μm; D3=5 μm; D6=D7=D9=D10, 8 μm; D8=D11=8.5 μm.

As shown in FIG. 2, the TFT in one embodiment of the present disclosure further includes the stopping structure 104 shown in FIG. 2 in addition to the other same parts as those of an existing TFT.

Figure 3:
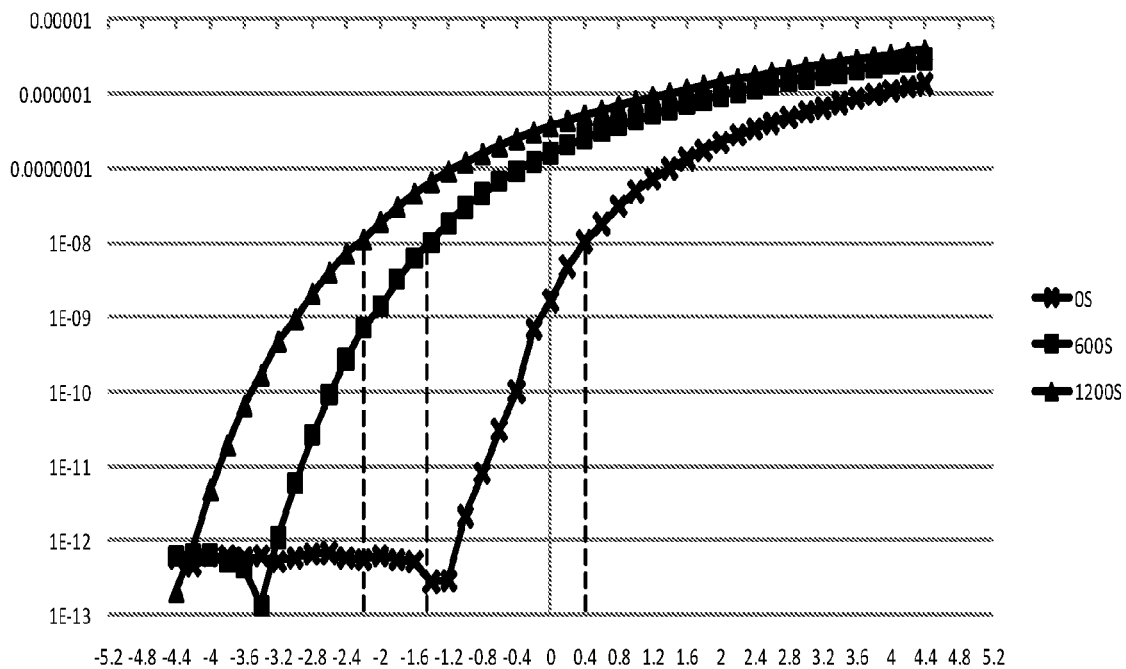
FIG. 3 shows testing curves of gate voltages Vg and source-to-drain currents Ids for an existing TFT.

Under the above-mentioned conditions, FIG. 3 shows corresponding curves of gate voltages Vg and source-to-drain currents Ids of the existing TFT tested at $0^{th}$, $600^{th}$ and $1200^{th}$ seconds.

As can be seen from FIG. 3, at the $0^{th}$ second, the gate voltage is about 0.4V so as to enable the source-to-drain current Ids to reach $10^{-8}$ A; at the $600^{th}$ second, the gate voltage is about −1.5V so as to enable the source-to-drain current Ids to reach $10^{-8}$ A; and at the $2000^{th}$ second, the gate voltage is about −2.2V so as to enable the source-to-drain current Ids to reach $10^{-8}$ A. In other words, after operating for 600 seconds, the threshold voltage drift of the existing TFT is about 1.9V (a difference between 0.4V and −1.5V), and after operating for 1200 seconds, the threshold voltage drift of the existing TFT is about 2.6V (a difference between 0.4V and −2.2V).

Figure 4:
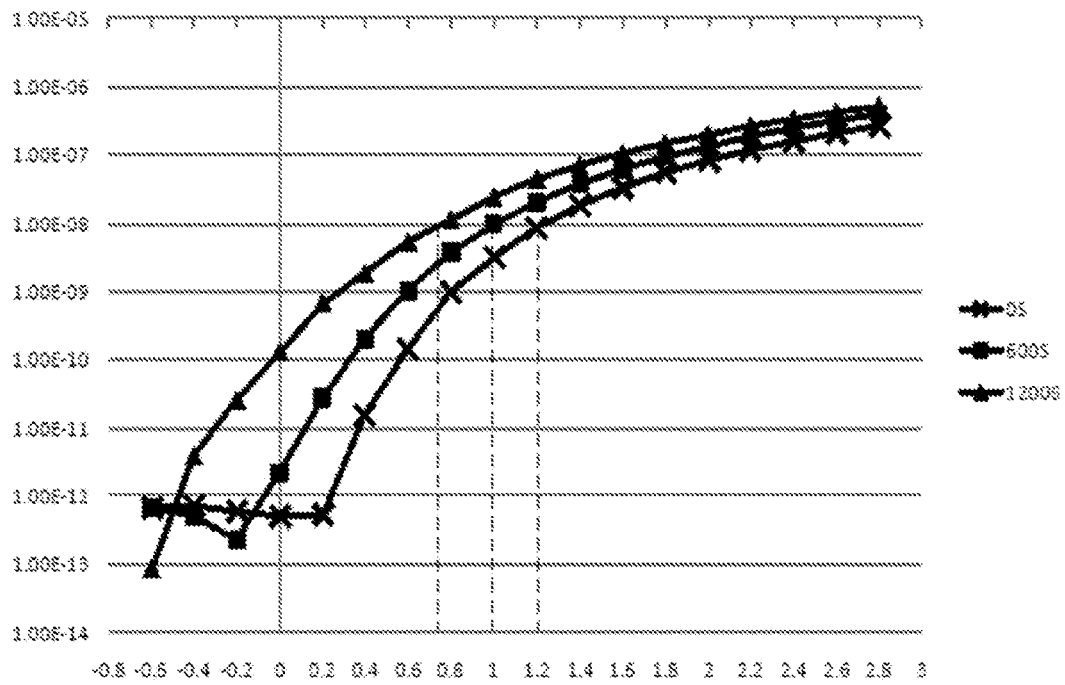
FIG. 4 shows testing curves of gate voltages Vg and source-to-drain currents Ids for the TFT according to one embodiment of the present disclosure.

Under the above-mentioned conditions, FIG. 4 shows corresponding curves of gate voltages Vg and source-to-drain currents Ids of the TFT in one embodiment of the present disclosure tested at $0^{th}$, $600^{th}$ and $1200^{th}$ seconds.

As can be seen from FIG. 4, at the $0^{th}$ second, the gate voltage is about 1.2V so as to enable the source-to-drain current Ids to reach $10^{-8}$ A; at the $600^{th}$ second, the gate voltage is about 1V so as to enable the source-to-drain current Ids to reach $10^{-8}$ A; and at the $1200^{th}$ second, the gate voltage is about 0.75V so as to enable the source-to-drain current Ids to reach $10^{-8}$ A. In other words, after operating for 600 seconds, the threshold voltage drift of the TFT in one embodiment of the present disclosure is about 0.2V (a difference between 1.2V and 1V), and after operating for 1200 seconds, the threshold voltage drift of the TFT is about 0.45V (a difference between 1.2V and 0.75V).

As can be seen from the above testing results, as compared with the existing TFT, the TFT with the stopping structure according to one embodiment of the present disclosure has at least following two advantages.

1. The threshold voltage drift is remarkably reduced.

After operating for 600 seconds and 1200 seconds, the threshold voltage drift of the TFT in one embodiment of the present disclosure is 0.2V and 0.45V, respectively, which are remarkably reduced compared with the threshold voltage drift of the existing TFT after operating for 600 seconds and 1200 seconds, i.e., 1.9V and 2.6V.

2. The threshold voltage is in a positive voltage range.

After operating for 600 seconds and 1200 seconds, the threshold voltages of the exiting TFT are −1.5V and −2.2V, respectively, and at this point, the source-to-drain current Ids is greater than $10^{-8}$ A even no electric signal is applied to the gate electrode (i.e., the gate voltage is 0V), resulting in an abnormal on state of the TFT.

However, after operating for 600 seconds and 1200 seconds, the threshold voltages of the TFT in one embodiment of the present disclosure are 1V and 0.75V, respectively, and at this point, the source-to-drain current Ids is far less than $10^{-8}$ A when no electric signal is applied to the gate electrode (i.e., the gate voltage is 0V), i.e., the TFT is in a normal off state.

In the above embodiments of the present disclosure, a length of a perpendicular line between parallel facing sides of the source electrode 102 and the drain electrode 103 is D (i.e., D2+D3+D4), a width of the stopping structure 104 in a direction parallel to the perpendicular line is W (i.e., D3).

In the above tests, W/D is 5/16. In other embodiments, when W/D is in a range of from 1/20 to 18/20, the threshold voltage drift may be reduced.

Figure 5:
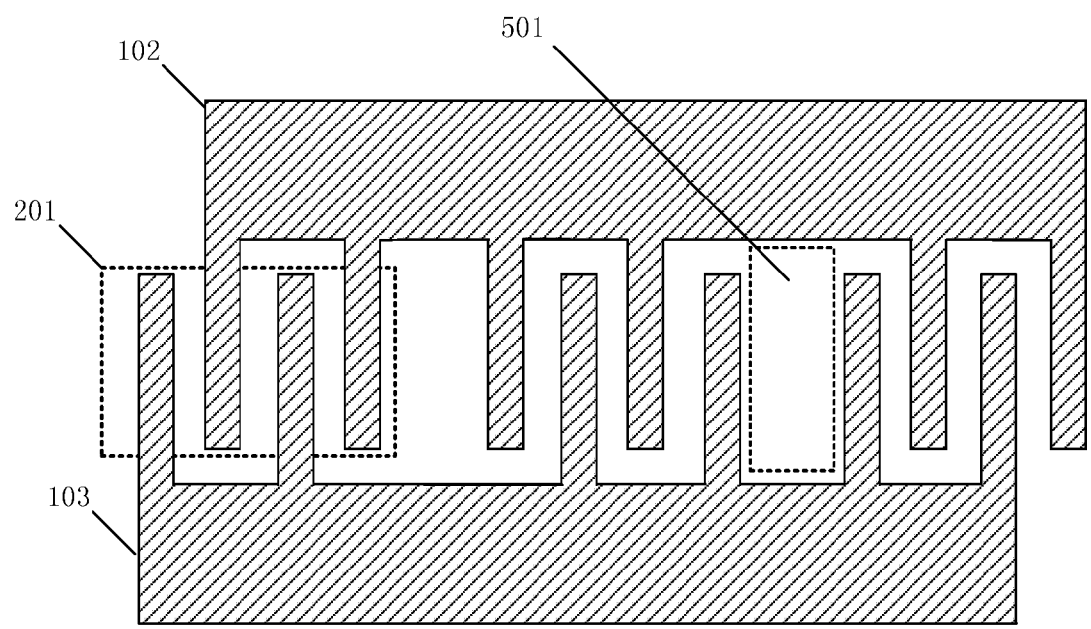
FIG. 5 is a schematic view showing an example of comb-like structures arranged opposite to each other in an interdigitated manner for a source electrode and a drain electrode of the TFT according to one embodiment of the present disclosure.

Upon determining the width-to-length ratio W/L, the TFT may be implemented through various structures, e.g., a structure with a plurality of via-holes as shown in FIG. 2. In order to ensure a good heat dissipation of the TFT, in some embodiments of the present disclosure, as shown in FIG. 5, the source electrode 102 and the drain electrode 103 are of comb-like structures arranged opposite to each other in an interdigitated manner. Teeth of the comb-like structures arranged opposite to each other in an interdigitated manner are divided into a plurality of tooth groups 201. A width of a first spacing region 501 between adjacent tooth groups 201 is greater than a distance between adjacent teeth in the tooth group 201. The stopping structure (not shown) is arranged between two adjacent teeth, one of which serves as the source electrode 102 and the other one of which serves as the drain electrode 103. The teeth adjacent to each other but belonging to different tooth groups serve as the drain electrode simultaneously, or the source electrode simultaneously.

Generally, when designing TFTs, the width-to-length ratio W/L closed related to the electrical property is determined in advance. When TFTs are of an identical W/L, currents flowing through respective source electrodes and drain electrodes are substantially the same under an identical voltage driving condition, and the generated heat is the same too. However, the TFTs with different shapes have different heat-dissipation performances.

In the structure as shown in FIG. 5, since the teeth arranged opposite to each other in an interdigitated manner are divided into a plurality of tooth groups 201, and a spacing distance between the tooth groups 201 is relatively large, thus the heat generated in the tooth groups 201 may be dissipated via the first spacing region 501 with a relatively large area, thereby improving the heat-dissipation performance of the TFT.

Meanwhile, since the teeth adjacent to each other but belonging to different tooth groups 201 serve as the drain electrode 103 simultaneously, or the source electrode 102 simultaneously, thus there is no current (or a very tiny current) in the first spacing region 501 between the adjacent tooth groups 201, thereby improving the heat-dissipation capability of the first spacing region 501 and then further improving the heat-dissipation performance of the TFT.

In the above structure as shown in FIG. 5, the heat-dissipation performance of the TFT is improved by using the first spacing region 501 between the tooth groups 201 to dissipate heat. In some other embodiments of the present disclosure, the heat may also be dissipated through a second spacing region 601 within each tooth group 201.

Figure 6:
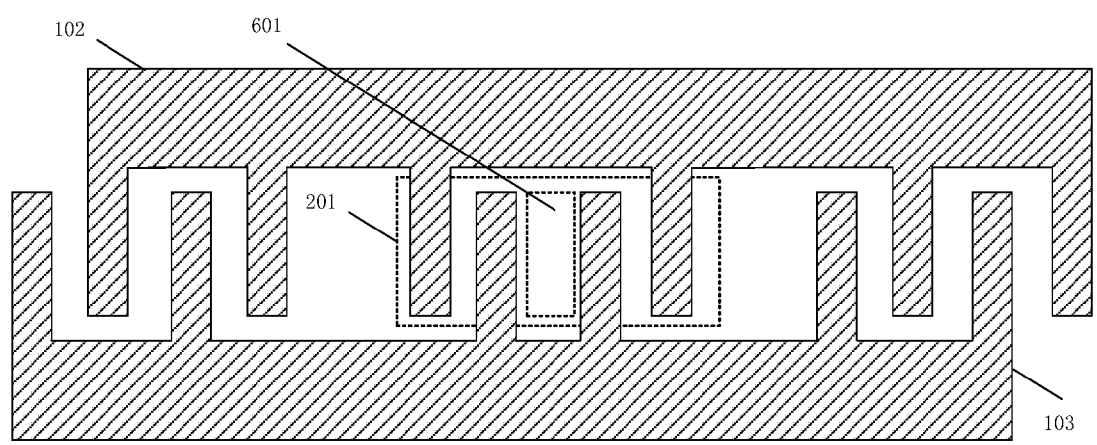
FIG. 6 is a schematic view showing another example of comb-like structures arranged opposite to each other in an interdigitated manner for a source electrode and a drain electrode of the TFT according to one embodiment of the present disclosure.

As shown in FIG. 6, the source electrode 102 and the drain electrode 103 are of comb-like structures arranged opposite to each other in an interdigitated manner. Two teeth serving as the drain electrode 103 are arranged between at least one pair of adjacent teeth serving as the source electrode 102, and the stopping structure 104 is arranged between the adjacent teeth, one of which serves as the source electrode 102 and the other one of which serves as the drain electrode 103.

In the structure as shown in FIG. 6, since the teeth arranged opposite to each other in an interdigitated manner are divided into a plurality of tooth groups 201, and there exist two adjacent teeth serving as the drain electrode 103 simultaneously within each tooth group 201, thus there is no current (or a very tiny current) generated between the teeth serving as the drain electrode 103 simultaneously. Therefore, a second spacing region 601 between the adjacent teeth serving as the drain electrode 103 simultaneously, can provide a better heat-dissipation effect, thereby improving the heat dissipation performance of the TFT.

It should be appreciated that, the structures in FIGS. 5 and 6 may be used separately, or in combination.

In the structures as shown in FIGS. 5 and 6, there merely exists one row of teeth arranged opposite to each other in an interdigitated manner. In order to further improve the heat dissipation performance, the teeth serving as the source electrode 102 and the teeth serving as the drain electrode 103 may be arranged in several rows.

Figure 7:
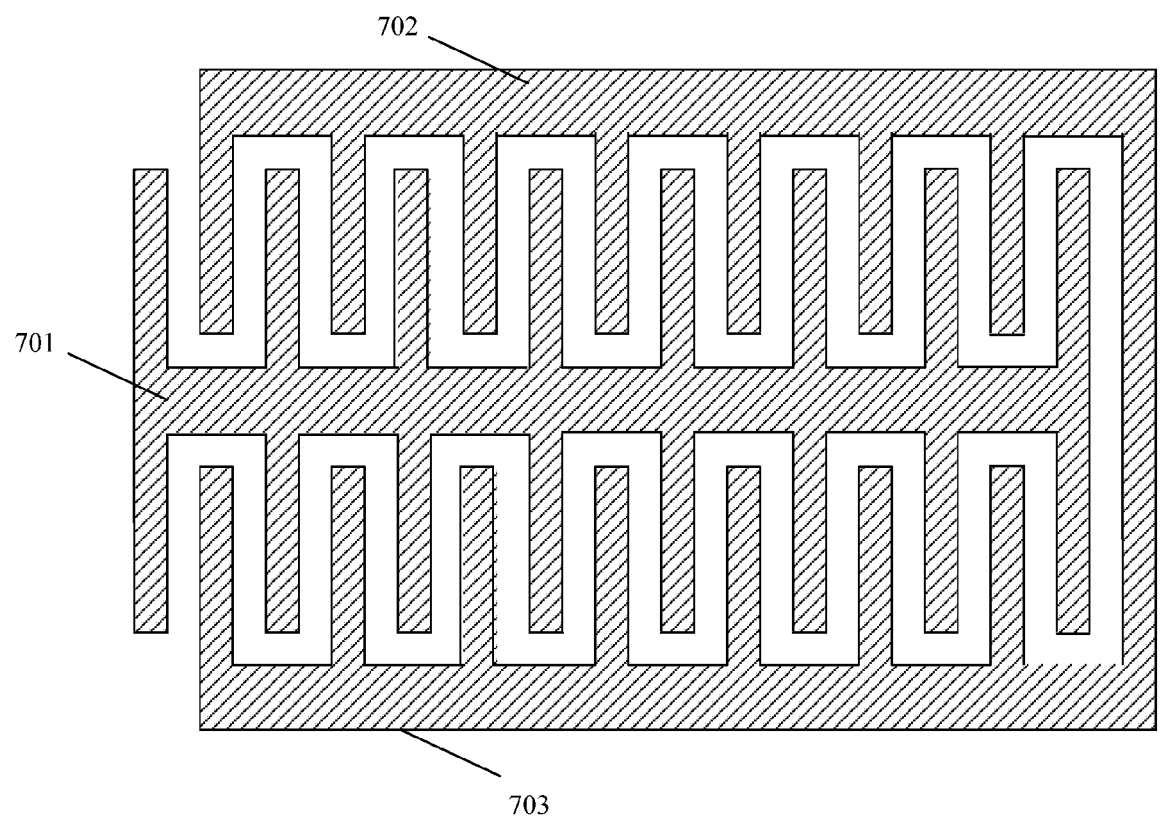
FIG. 7 is a schematic view showing yet another example of comb-like structures arranged opposite to each other in an interdigitated manner for a source electrode and a drain electrode of the TFT according to one embodiment of the present disclosure.

As shown in FIG. 7, the drain electrode includes a first comb handle 701; a first teeth row and a second teeth row which are arranged at two sides of the first comb handle 701 and electrically connected to the first comb handle 701.

The source electrode includes a second comb handle 702; a third teeth row arranged at a side of the second comb handle 702, electrically connected to the second comb handle 702 and arranged opposite to the first teeth row in an interdigitated manner; a third comb handle 703 electrically connected to the second comb handle; and a fourth teeth row arranged at a side of the third comb handle 703, electrically connected to the third comb handle and arranged opposite to the second teeth row in an interdigitated manner. The stopping structure (not shown) is arranged between the two adjacent teeth, one of which serves as the source electrode 102, and the other one of which serves as the drain electrode 103.

In the structure as shown in FIG. 7, the teeth serving as the drain electrode 103 are arranged in two rows, and the first comb handle 701 in the TFT may be used for heat dissipation in a better manner as compared with the existing TFT where the heat is dissipated at its periphery.

Meanwhile, the arrangement modes of the tooth groups in FIGS. 5 and 6 may also be applied to any teeth row in FIG. 7, so as to further improve the heat dissipation performance of the TFT.

The TFT in the embodiments of the present disclosure may be applied to various circuit structures. As shown in FIG. 1, the TFT includes the gate electrode, the semiconductor layer 101, the etch stop layer, and the source electrode 102 and the drain electrode 103 connected to the semiconductor layer 101. The TFT further includes the stopping structure 104 over the etch stop layer.

The stopping structure 104 is electrically isolated from the source electrode 102 and the drain electrode 103. An orthogonal projection of the stopping structure 104 onto the etch stop layer at least partially overlaps an orthogonal projection of the semiconductor layer 101 onto the etch stop layer.

Alternatively, the orthogonal projection of the stopping structure 104 onto the etch stop layer is located within a region where the orthogonal projection of the semiconductor layer 101 onto the etch stop layer is located.

The stopping structure 104 may be formed by a single etching process together with the source electrode 102 and the drain electrode 103.

A length of a perpendicular line between parallel facing sides of the source electrode 102 and the drain electrode 103 is D, and a width of the stopping structure 104 in a direction parallel to the line is W. When W/D is in a range of from 1/20 to 18/20, the threshold voltage drift can be reduced.

As shown in FIG. 5, the source electrode 102 and the drain electrode 103 are of comb-like structures arranged opposite to each other in an interdigitated manner, teeth of the comb-like structures arranged opposite to each other in an interdigitated manner are divided into a plurality of tooth groups 201, and a width of the first spacing region between the adjacent tooth groups 201 is greater than a distance between the adjacent teeth in each tooth group 201. The stopping structure is arranged between two adjacent teeth, one of which serves as the source electrode 102 and the other one of which serves as the drain electrode 103. The teeth adjacent to each other but belonging to different tooth groups serve as the drain electrode simultaneously, or the source electrode simultaneously.

The spacing distance between the tooth groups 201 is relatively large, so the heat generated by each tooth group 201 may be dissipated via the first spacing region 501 with a relatively large area, thereby improving the heat-dissipation performance of the TFT. Meanwhile, the teeth adjacent to each other but belonging to different tooth groups 201 serve as the drain electrode 103 simultaneously or the source electrode 102 simultaneously, so there is no current (or a very tiny current) generated in the first spacing region 501 between the adjacent tooth groups 201, thereby improving the heat-dissipation capability of the first spacing region 501 and further improving the heat-dissipation performance of the TFT.

In an alternative embodiment, as shown in FIG. 6, the source electrode 102 and the drain electrode 103 are of comb-like structures arranged opposite to each other in an interdigitated manner, and two teeth serving as the drain electrode 103 are arranged between at least one pair of adjacent teeth serving as the source electrode 102. The stopping structure 104 is arranged between the adjacent teeth, one of which serves as the source electrode 102 and the other one of which serves as the drain electrode 103.

There exist two adjacent teeth serving as the drain electrode 103 simultaneously within each tooth group 201, so there is no current (or a very tiny current) generated between the teeth serving as the drain electrode 103 simultaneously. Thus, the second spacing region 601 between the adjacent teeth serving as the drain electrode 103 simultaneously can provide a better heat-dissipation effect, thereby improving the heat dissipation performance of the TFT.

Various circuit structures, e.g., a gate driver circuit, may include a capacitor structure used in combination with the TFT. When the circuit structure further includes the capacitor structure, the capacitor structure includes a first polar plate and a second polar plate which is formed by the gate electrode of the TFT. The first polar plate is arranged at a layer identical to the source electrode and the drain electrode of the TFT and connected to the drain electrode of the TFT.

A representative one of the above circuit structure is a shift register unit in the gate driver circuit, in which the source electrode and the drain electrode of the TFT are connected to a signal input node and a signal output node, respectively, the gate electrode of the TFT is connected to a pull-up node, one end of the capacitor structure is connected to the pull-up node, and the other end of the capacitor structure is connected to the signal output node.

In the shift register unit, as shown in FIG. 7, the drain electrode includes: the first comb handle 701 electrically connected to the first polar plate; and the first teeth row and the second teeth row which are arranged at two sides of the first comb handle 701 and electrically connected to the first comb handle 701.

The source electrode includes the second comb handle 702; the third teeth row arranged at a side of the second comb handle 702, electrically connected to the second comb handle 702 and arranged opposite to the first teeth row in an interdigitated manner; the third comb handle 703 electrically connected to the second comb handle 702; and the fourth teeth row arranged at a side of the third comb handle 703, electrically connected to the third comb handle 703 and arranged opposite to the second teeth row in an interdigitated manner. The stopping structure 104 is arranged between the adjacent teeth, one of which serves as the source electrode 102 and the other one of which serves as the drain electrode 103.

In some embodiments of the present disclosure, in order to improve the heat dissipation performance of the shift register unit, the teeth arranged at at least one side of the first comb handle and arranged opposite to each other in an interdigitated manner are divided into a plurality of tooth groups. A width of the first spacing region between the adjacent tooth groups is greater than a distance between the adjacent teeth in the tooth group. The teeth adjacent to each other but belonging to different tooth groups serve as the drain electrode simultaneously, or the source electrode simultaneously.

The teeth arranged opposite to each other in an interdigitated manner are divided into a plurality of tooth groups, and the spacing distance between the tooth groups is relatively large, so the heat generated by each tooth group may be dissipated via the first spacing region with a relatively large area, thereby improving the heat-dissipation performance of the TFT.

Meanwhile, the teeth adjacent to each other but belonging to different tooth groups serve as the drain electrode simultaneously or the source electrode simultaneously, so there is no current (or a very tiny current) generated in the first spacing region between the adjacent tooth groups, thereby improving the heat-dissipation capability of the first spacing region and further improving the heat-dissipation performance of the TFT.

As is known in the art, there is an active layer in the TFT. When an electric signal having a voltage greater than a threshold voltage is applied to the gate electrode, the active layer functions as a conductor, and when an electric signal having a voltage less than the threshold voltage is applied to the gate electrode, the active layer functions as an insulator.

Meanwhile, in some embodiments of the present disclosure, the capacitor structure includes a first polar plate and a second polar plate which is formed by the gate electrode of the TFT. The first polar plate is arranged at a layer identical to the source electrode and the drain electrode of the TFT and connected to the drain electrode of the TFT. When there exists the active layer between the first polar plate and the second polar plate, a distance between the polar plates of the capacitor structure may be varied along with a change in the properties of the active layer, and thereby the capacitance may be changed. Then, the normal operation of the shift register unit may be adversely affected.

In order to ensure the normal operation of the shift register unit, in some embodiments of the present disclosure, the active layer under the first comb handle is removed.

As mentioned above, when the active layer under the first comb handle is removed, the first comb handle becomes a portion of the polar plate of the capacitor structure, and can provide a good heat-dissipation effect.

When the teeth adjacent to each other but belonging to different tooth groups serve as the drain electrode simultaneously or the source electrode simultaneously, there is no current between the adjacent tooth groups. In order to further improve the heat dissipation performance of the shift register unit and make full use of the limited space, in some embodiments of the present disclosure, an extension part is further arranged on the first comb handle and extends into a gap between the adjacent tooth groups, and the active layer under the extension part is removed.

In other words, when the teeth adjacent to each other but belonging to different tooth groups serve as the drain electrode simultaneously or the source electrode simultaneously, no current is transmitted between the adjacent tooth groups. This is to say, there is a superfluous region between the adjacent tooth groups for the TFT, and this superfluous region serves as a portion of the polar plate of the capacitor structure in some embodiments of the present disclosure, so as to make full use of the space. In addition, the extension part extending into the gap between the adjacent tooth groups may be used to dissipate the heat generated by the TFT.

The present disclosure further provides in some embodiments a TFT including a source electrode and a drain electrode. As shown in FIG. 7, the drain electrode includes: a first comb handle 701; and a first teeth row and a second teeth row arranged at two sides of the first comb handle 701 and electrically connected to the first comb handle 701. The source electrode includes: a second comb handle 702; a third teeth row arranged at a side of the second comb handle 702, electrically connected to the second comb handle 702 and arranged opposite to the first teeth row in an interdigitated manner; a third comb handle 703 electrically connected to the second comb handle 702; and a fourth teeth row arranged at a side of the third comb handle 703, electrically connected to the third comb handle 703 and arranged opposite to the second teeth row in an interdigitated manner.

The above-mentioned TFT differs from the existing TFT in that the first comb handle 701 serving as a portion of the drain electrode is located within the entire TFT, so that the entire TFT can dissipate the heat generated by the TFT through the first comb handle 701 in the middle, thereby improving the heat dissipation performance of the TFT.

In the above-mentioned TFT, teeth arranged at at least one side of the first comb handle and arranged opposite to each other in an interdigitated manner are divided into a plurality of tooth groups, a width of the first spacing region between the adjacent tooth groups is greater than a distance between the adjacent teeth in the tooth group, and the teeth adjacent to each other but belonging to different tooth groups serve as the drain electrode simultaneously or the source electrode simultaneously. As a result, the heat dissipation performance of the TFT can be improved.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A circuit structure, comprising a thin film transistor (TFT), the TFT comprising a gate electrode, a semiconductor layer, an etch stop layer, and a source electrode and a drain electrode connected to the semiconductor layer;
   wherein the TFT further comprises a stopping structure arranged over the etch stop layer; the stopping structure is electrically isolated from the source electrode and the drain electrode; and an orthogonal projection of the stopping structure onto the etch stop layer at least partially overlaps an orthogonal projection of the semiconductor layer onto the etch stop layer;
   wherein the stopping structure is made of conductive metal;
   the stopping structure is located within an area between the source electrode and the drain electrode; and
   the stopping structure is spaced from both of the source electrode and the drain electrode;
   wherein the circuit structure further comprises a capacitor structure comprising a first polar plate and a second polar plate which is formed by the gate electrode of the TFT, and the first polar plate is arranged at a layer identical to the source electrode and the drain electrode of the TFT and connected to the drain electrode of the TFT;
   wherein the circuit structure is a shift register unit;
   the source electrode and the drain electrode of the TFT are connected to a signal input node and a signal output node, respectively;
   the gate electrode of the TFT is connected to a pull-up node; and
   one end of the capacitor structure is connected to the pull-up node, and the other end of the capacitor structure is connected to the signal output node.

2. The circuit structure according to claim 1, wherein the orthogonal projection of the stopping structure onto the etch stop layer is located within a region where the orthogonal projection of the semiconductor layer onto the etch stop layer is located.

3. The circuit structure according to claim 1, wherein the stopping structure, the source electrode and the drain electrode are formed by a single etching process.

4. The circuit structure according to claim 1, wherein a length of a perpendicular line between parallel facing sides of the source electrode and the drain electrode is D; a width of the stopping structure in a direction parallel to the perpendicular line is W, and W/D is in a range of from 1/20 to 18/20.

5. The circuit structure according to claim 1, wherein the source electrode and the drain electrode are of comb-like structures arranged opposite to each other in an interdigitated manner; teeth of the comb-like structures arranged opposite to each other in an interdigitated manner are divided into a plurality of tooth groups; a spacing distance between the adjacent tooth groups is greater than a distance between the adjacent teeth in the tooth group; the stopping structure is arranged between two adjacent teeth, one of which serves as the source electrode and the other one of which serves as the drain electrode; and the teeth adjacent to each other but belonging to different tooth groups serve as the drain electrode simultaneously or the source electrode simultaneously.

6. The circuit structure according to claim 1, wherein the source electrode and the drain electrode are of comb-like structures arranged opposite to each other in an interdigitated manner; two teeth serving as the drain electrode are arranged between at least one pair of adjacent teeth serving as the source electrode; and the stopping structure is arranged between the adjacent teeth, one of which serves as the source electrode and the other one of which serves as the drain electrode.

7. The circuit structure according to claim 1, wherein the drain electrode comprises:
 a first comb handle electrically connected to the first polar plate; and
 a first teeth row and a second teeth row arranged at two sides of the first comb handle, respectively, and electrically connected to the first comb handle, and the source electrode comprises:
 a second comb handle;
 a third teeth row arranged at a side of the second comb handle, electrically connected to the second comb handle and arranged opposite to the first teeth row in an interdigitated manner;
 a third comb handle electrically connected to the second comb handle; and
 a fourth teeth row arranged at a side of the third comb handle, electrically connected to the third comb handle and arranged opposite to the second teeth row in an interdigitated manner;
 wherein the stopping structure is arranged between the adjacent teeth, one of which serves as the source electrode and the other one of which serves as the drain electrode.

8. The circuit structure according to claim 7, wherein the teeth arranged at at least one side of the first comb handle and arranged opposite to each other in an interdigitated manner are divided into a plurality of tooth groups; a spacing distance between the adjacent tooth groups is greater than a distance between the adjacent teeth in the tooth group; and the teeth adjacent to each other but belonging to different tooth groups serve as the drain electrode simultaneously or the source electrode simultaneously.

9. The circuit structure according to claim 8, wherein an active layer under the first comb handle is removed.

10. The circuit according to claim 9, wherein an extension part is further arranged on the first comb handle and extends into a gap between the adjacent tooth groups, and the active layer under the extension part is removed.

* * * * *